United States Patent [19]

Heaslett

[11] E Re. 29,529

[45] Reissued Jan. 31, 1978

[54] EQUALIZATION CIRCUIT

[75] Inventor: Alastair M. Heaslett, Palo Alto, Calif.

[73] Assignee: Ampex Corporation, Redwood City, Calif.

[21] Appl. No.: 682,556

[22] Filed: May 3, 1976

Related U.S. Patent Documents

Reissue of:

[64] Patent No.: 3,940,709
Issued: Feb. 24, 1976
Appl. No.: 534,357
Filed: Dec. 19, 1974

[51] Int. Cl.[2] ..... H03F 1/36

[52] U.S. Cl. ..... 330/107; 179/1 D; 330/51; 330/151

[58] Field of Search ..... 330/31, 21, 51, 107, 330/109, 126, 151; 333/28 R, 28 T; 179/1 D

[56] References Cited

U.S. PATENT DOCUMENTS

| | | | |
|---|---|---|---|
| 2,450,818 | 10/1948 | Vermillion | 328/167 X |
| 2,589,133 | 3/1952 | Purington | 330/126 |
| 2,760,011 | 8/1956 | Berry | 330/126 |
| 2,895,111 | 7/1959 | Rothe | 333/28 R |
| 3,026,480 | 3/1962 | Usher | 333/28 R X |
| 3,336,540 | 8/1967 | Kwartiroff et al. | 333/28 |
| 3,530,394 | 9/1970 | Deluach | 330/151 X |
| 3,660,785 | 5/1972 | Hosokawa | 333/28 R |
| 3,665,345 | 5/1972 | Dolby | 330/151 X |
| 3,794,935 | 2/1974 | Tsuchna et al. | 330/151 X |
| 3,818,362 | 6/1974 | Van Sluys | 330/151 X |

OTHER PUBLICATIONS

Aikens et al., "Cut Butterworth Filter Phase Distortion", *Electronic Design* 24, Nov. 22, 1969, pp. 74–77.
*Toshiba Review*, Jan.–Feb. 1970, pp. 55–58.

*Primary Examiner*—James B. Mullins
*Attorney, Agent, or Firm*—Elizabeth E. Strnad

[57] ABSTRACT

A frequency equalization circuit includes an active filter circuit. The filter circuit differentiates the input signal. A plurality of adjustable resistances are connected to the differentiator corresponding to a plurality of operating or frequency ranges. A switch selects one resistance in accordance with one selected operating range to connect the filter circuit to an amplifier.

21 Claims, 3 Drawing Figures

EQUALIZATION CIRCUIT

Matter enclosed in heavy brackets [ ] appears in the original patent but forms no part of this reissue specification; matter printed in italics indicates the additions made by reissue.

BACKGROUND OF THE INVENTION

There are a number of applications where a high frequency equalization circuit is needed to provide a signal rising or falling in amplitude with frequency over a plurality of possibly overlapping operating ranges each operating range covering a range of frequencies and adjustable within each range. One significant area of application is in signal recorders and especially audio recorders. Other applications exist such as plural range tone controls.

Due to the signal transfer characteristics of present audio recorders, and especially the characteristics of recording tape, the high frequency range of the audio signal becomes attenuated by the recording and reproduction process. This attenuation occurs to varying degrees dependent upon a number of variables including relative transducer to record medium speed and the frequency characteristics of the tape. Consequently, an adjustable high frequency amplitude equalization circuit is commonly employed in the audio record circuitry of the recorder to compensate for the attenuation. The audio equalization circuitry may be designed into the audio preamplifier.

In the past, passive RC filters utilizing adjustable capacitors have been used with limited success as adjustable amplitude equalizers. For example, many multiple speed audio tape recorders have tape speed capabilities ranging from 3¾ inches per second to 30 ips. Recorders having a wide range of selectable operating speeds have required for each speed a separate filter with a variable capacitor. While such passive equalizers effect equalization, they do so at the expense of appreciable overall signal attenuation and concomitant loss of signal power and quality. Because the filters require a larger number of elements and a variable capacitor for each tape speed, the passive equalizers are expensive.

It is preferable to utilize an active filter to minimize signal attenuation. The use, however, of a separate active filter for each tape speed in a multiple speed machine can increase expenses beyond the cost of using separate passive filters.

Many filter circuits, both passive and active, can introduce a significant amount of noise into the signal. Many introduce noise when the equalization provided by the circuit is adjusted to zero. The same level of noise may be introduced regardless of the amount of equalization provided. Active filters, moreover, may introduce noise into the system inversely to the level of signal amplitude enhancement or equalization introduced. This [later] *latter* case is especially undesirable because the signal to noise ratio becomes [high] *low* with small amounts of equalization.

SUMMARY OF THE INVENTION

Accordingly, the present invention constitutes a high frequency amplitude equalization circuit, preferably for the record circuitry of a signal recorder, that is adjustable to provide a desired signal frequency response over a wide range of relative transducer to record medium speeds. The signal to be equalized is passed through two paths, one of which includes an active filter circuit. The active filter circuit is responsive to the signal to vary with frequency the amplitude of any of its frequency components lying in a predetermined frequency range. In one preferred embodiment, the active filter circuit is constructed to vary the amplitude of the signal's frequency components in a high frequency range. The signal from the active filter circuit is combined with the signal passed through the other of the two paths for further utilization. The active filter circuit comprises a differentiating circuit, *formed by* an amplifier *circuit,* and a plurality of adjustable resistances selectable one for each machine operating speed. Preferably, the differentiating circuit is [an RC circuit connected to the input of the amplifier] *implemented by an operational amplifier having an input RC series circuit and a feedback resistor cooperating to provide the differentiation.* The output of the amplifier, which is varying with frequency, is adjusted by one of the plurality of adjustable resistances selected according to desired speed thus providing equalization over one of a plurality of operating or frequency ranges. The [RC differentiator and amplifier are] *differentiating circuit is* utilized for all operating speeds. Additional adjustable resistances only are needed for additional operating speeds. In the preferred embodiment, the filter circuit is placed in parallel with the input resistance of [an] *a summing* operational amplifier in the audio preamplifier circuit. Thus, the input signal follows two paths. In one path, the signal is fed directly to the *summing* amplifier through the input resistor and in the other path, the signal is fed through the filter circuit to the *summing* amplifier. Preferably, the adjustable resistances are placed in parallel between the output of the filter amplifier and ground. This arrangement causes a minimum of noise to be introduced into the signal. When no high frequency equalization or boost is introduced into the circuit, i.e., when the tap of the adjustable resistance selected is turned to ground, no noise is introduced. Other additional pre-emphasis circuits may be conveniently added to affect a low frequency amplitude boost or to provide other compensation, if desired, by using the feedback path from the output of the summing amplifier.

DESCRIPTION OF THE PREFERRED EMBODIMENTS

Figure 1:
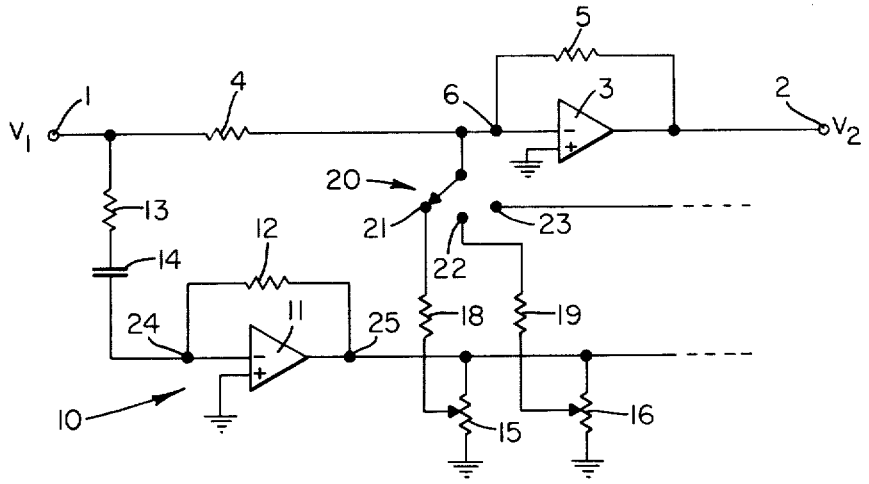
FIG. 1 is a schematic circuit diagram of an audio preamplifier utilizing an embodiment of the equalization circuit of the present invention.

In FIG. 1, [1,] terminal 1 is the input to the audio preamplifier shown. Terminal 2 is the output. The main signal path of the preamplifier comprises input resistor 4, amplifier 3, and feedback resistor 5 connected between the amplifier input terminal 6 and the output terminal 2. The gain of the *summing operational* amplifier 3 is, with little error:

$$\left[A = \frac{R_5}{R_4}\right]$$

$$A = -\frac{R_5}{R_4} \quad (1)$$

Where

A = the closed loop gain of the operational amplifier.

$R_5$ = the resistance of feedback resistor 5

$R_4$ = the resistance of input resistor 4

Connected in parallel with input resistor 4 is an active filter circuit 10, which is designed to perform a high frequency signal amplitude pre-emphasis. Any signal applied to input terminal 1 will thus pass through input resistor 4 and the filter circuit 10. The resultant signals will be summed at terminal 6 and then amplified by amplifier 3. The signal passing through the filter circuit is emphasized and thereafter summed with the signal passing through resistor 4 and amplified by amplifier 3 to form the desired equalized signal.

The active filter circuit 10 comprises [an] *a differentiating operational* amplifier 11 with a feedback resistor 12. Connected between terminal 1 and the input 24 of the amplifier 11 is a series RC network comprising resistor 13 and capacitor 14. *The capacitor 14 and resistor 13 represent the input impedance of the differentiating operational amplifier 11.* A plurality of adjustable resistors 15, 16 are connected between the output 25 of amplifier [12] *11* and ground. There is one adjustable resistor for each operating speed. Connected respectively to the adjustable taps of adjustable resistors 15, 16 are connecting resistors 18, 19.

A switch 20 selectively connects the [amplifier's] input terminal 6 *of summing amplifier 3* to one of the connecting resistors 18, 19. One terminal 21, 22, 23 of switch 20 is selected according to the selected operating speed.

In operation, an audio signal is coupled to terminal 1. The signal passes through the path formed by resistor 4 and also through the path formed by resistor 13, capacitor 14 and amplifier 11 where it is differentiated and amplified. The differentiation of the signal causes signal amplitude in this embodiment to rise with frequency above a predetermined frequency as described below. The selection of the component values of the active filter circuit determines the frequency range of the resultant high frequency pre-emphasis. In the preferred embodiment the output signal of amplifier 11 rises at 6 db/octave with increasing frequency. The limit to this rise is set by $R_{13}C$ where $R_{13}$ is the value of resistor 13 and C is the value of capacitor 14.

One terminal, for example 21, of switch 20, is selected according to a chosen operating speed to connect adjustable resistor 15 to terminal 6 by way of resistor 18. Accordingly, a portion of the differentiated signal dependent on the position of the tap of the adjustable resistor is summed with the undifferentiated signal, which has passed through resistor 4 to terminal 6. The resultant signal is amplified by operational amplifier 3 and available as an equalized output at terminal 2.

[The frequency above which the signal is pre-emphasized by the active filter circuit 10 is determined by:]

$$\left[ f_1 = \frac{1}{2\pi C\left(K\frac{R_{12}R_4}{R_{18}} + R_{13}\right)} \right]$$

*The ratio of the output voltage to the input voltage for operational amplifiers is given by the equation*

$$V_{out} = -\frac{Z_{fb}}{Z_{in}} V_{in} \quad (2)$$

*Where*

$V_{out}$ = *the output voltage;*

$V_{in}$ = *the input voltage;*

$Z_{fb}$ = *the feedback impedance of the operational amplifier; and*

$Z_{in}$ = *the input impedance of the operational amplifier.*

*For the differentiating operational amplifier 11, the equation is*

$$V_{25} = -\frac{R_{12}}{R_{13} + \frac{1}{jwC}} V_1 \quad (3)$$

*Where*

$V_{25}$ = *the output voltage at terminal 25;*

$V_1$ = *the input voltage at terminal 1 of the equalization circuit;*

$R_{12}$ = *the resistance of feedback resistor 12;*

$R_{13}$ = *the resistance of input resistor 13; and*

$1/jwC$ = *the impedance of input capacitor 14.*

*After rationalizing the equation (3) becomes:*

$$V_{25} = -\frac{jwCR_{12}}{1 + jwCR_{13}} V_1 \quad (4)$$

*Equation (4) may be re-arranged as:*

$$V_{25} = -\left(\frac{1}{1 + jwCR_{13}}\right)(jwCR_{12})\, V_1 \quad (5)$$

*In the frequency range over which signal pre-emphasis occurs, the current from active filter 10 into the summing terminal 6 through resistor 18 is equal to or greater than the current into the terminal 6 from resistor 4. The differentiating operational amplifier 11 provides a current to the summing terminal 6 through a voltage divider formed by the adjustable resistor 15 and through the resistor 18. The open circuit source voltage at tap of resistor 15 with the load formed by resistor 18 and following circuit at terminal 6 disconnected is,*

$$V_T = KV_{25} \quad (6)$$

*Where*

$V_T$ = *the voltage at the tap of resistor 15;*

$K$ = *the fraction of the resistance $R_{15}$ between the tap and ground.*

*The source impedance seen at the tap of resistor 15 as determined by Thevenin's theorem is*

$$Z_T = \frac{KR_{15}(1 - K)R_{15}}{KR_{15} + (1 - K)R_{15}} = K(1 - K)R_{15} \quad (7)$$

*Where*

$R_{15}$ = *the resistance of adjustable resistor 15.*

*The current flowing into terminal 6 through resistor 18 from the differentiating operational amplifier 11 is*

$$I_{18} = \frac{KV_{25}}{R_{18} + K(1 - K)R_{15}} \tag{8}$$

*Where*

$R_{18}$ = *the resistance of resistor 18.*

*At lower signal frequencies,* $wCR_{13}$ *is much less than 1 and equation (5) reduces to*

$$V_{25} = -jwCR_{12}V_{in} \tag{9}$$

*The current* $I_{18}$ *at lower signal frequencies is obtained by substituting equation (9) for* $V_{25}$ *in equation (8), which gives*

$$I_{18} = -\frac{jwCR_{12}KV_1}{R_{18} + K(1 - K)R_{15}} \tag{10}$$

*The current into summing terminal 6 through resistor 4 is*

$$I_4 = V_1/R_4 \tag{11}$$

*Where*

$R_4$ = *the resistance of the resistor 4.*

*As discussed above, pre-emphasis occurs when the absolute magnitude of the current* $I_{18}$ *is equal to or greater than that of* $I_4$, *that is when*

$$|I_4| \leqq |I_{18}| \tag{12}$$

*After substitution for* $I_4$ *and* $I_{18}$ *from equations (11) and (10) into equation (12) we obtain:*

$$\left|\frac{V_1}{R_4}\right| \leqq \left|\frac{wCR_{12}K\,V_1}{R_{18} + K(1 - K)R_{15}}\right| \tag{13}$$

*After substituting for* $w = 2\pi f$ *and solving for the frequency f, the lower frequency limit* $f_1$ *at which pre-emphasis occurs can be found and is given by the equation:*

$$f_1 = \frac{R_{48} + R_{15}K(1 - K)}{2\pi CKR_4R_{12}} \tag{14}$$

where $R_4$ = the resistance of resistor 4

$R_{12}$ = the resistance of resistor 12

[$R_{13}$ = the resistance of resistor 13]

$R_{15}$ = *the resistance of resistor 15*

$R_{18}$ = the resistance of connecting resistor 18

C = capacitance of capacitor 14

K = the fraction of the adjustable resistor 15 between the tap and ground $f_1$ = frequency.

The pre-emphasis frequency, then, is dependent on the positioning of the tap on the adjustable resistor 15. The lowest pre-emphasized frequency is determined, when K = 1, by the values of $R_4$, $R_{12}$, $R_{18}$ and C. When the tap is set to ground, K = 0 and there is no pre-emphasis.

[The] *As noted above, the limit of the 6db/octave rise in the output of amplifier 11 with increasing frequency is determined by* $CR_{13}$. *From equation (5), it is seen the frequency at which this occurs is determined by the denominator as* $wCR_{13}$ *approaches 1. Thus, the* upper frequency limit of signal pre-emphasis is determined by $$f_2 = \frac{1}{2\pi R_{13}C} \tag{15}$$

*Equation (4) also defines the phase relationship between the output and input signals of the differentiating operational amplifier 11. This equation (4) can be rewritten in terms of real and imaginary components as*

$$V_{25} = \left\{\frac{w^2C^2R_{12}R_{13}}{1 + w^2C^2R_{13}^2} + j\left(\frac{wCR_{12}}{1 + w^2C^2R_{13}^2}\right)\right\}V_1 \tag{16}$$

*From equation (16) it can be seen that the output voltage at terminal 25 always lags in phase with respect to the input voltage at terminal 1. From equation (5), it can further be seen that the phase lag is 90° at frequencies below* $f_2$ *where* $wCR_{13}$ *is much less than 1.*

It can be readily seen that where different amplitude equalization is required by different tape speeds, only the adjustable resistor 15 and the connecting resistor 18 need be substituted with new values such as resistors 16 and 19. Resistors 12 and 13, capacitor 14 and amplifier 11 are common to all speeds.

When there is zero boost or equalization, the tap of the adjustable resistor is set to ground and no output signal from the active filter circuit is transferred to the main circuit path. Consequently, there is no noise contribution from the pre-emphasis circuit filter. When boost is provided, output noise remains substantially constant until K becomes close to unity in which case some additional noise is contributed by amplifier 11 at high frequencies only. Thus a minimum amount of noise is introduced into the circuit.

Figure 2:
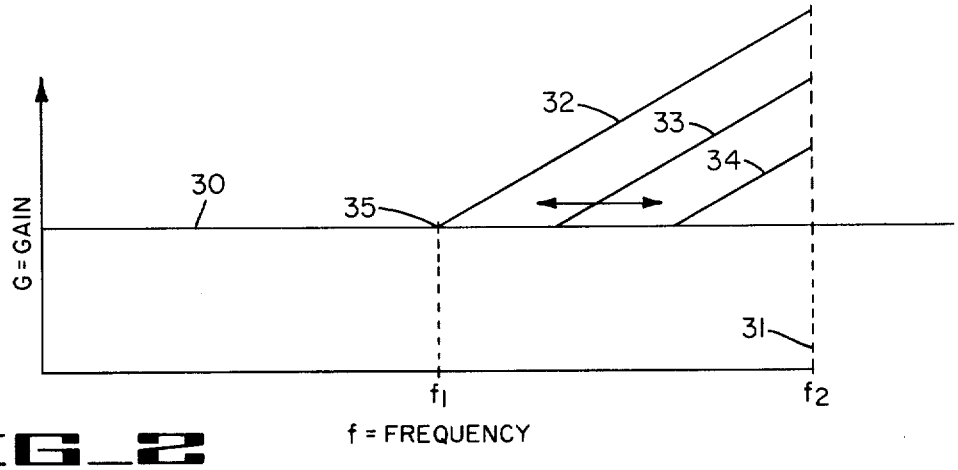
FIG. 2 is a graph representing the varying response curves available utilizing the present invention.

FIG. 2 shows a family of curves depicting the range of high frequency equalization curves obtainable at a given tape speed as resistor 15, for example, is adjusted. As resistor 15 is adjusted, frequency $f_1$ will vary as shown by the arrow. Frequency $f_1$ will vary from a minimum amount when K = 1 to higher amounts when K is reduced. The selection of another adjustable resistor 16 is necessary to provide a different range over which $f_1$ must vary due to different signal equalization required by machine characteristics which change with operating speed. Along the ordinate is plotted gain G, and along the abscissa is plotted frequency f. The gain of amplifier 3 is shown at 30 and equals $R_5/R_4$. The upper *frequency* limit of boost 31 is given by the equation for $f_2$. The family of curves 32, 33, 34 represents the range of equalization that is obtained by varying K. The lowest possible corner frequency, when K = 1, is shown at 35. As the corner frequency increases, the amount of signal amplitude boost [decrease] *decreases* until none is present in the equalization.

Accordingly, the output of amplifier 3 consists of two components, one whose amplitude is constant with frequency and one of which is contributed by the pre-emphasis circuit and whose amplitude rises with frequency over a selected range of frequencies.

Figure 3:
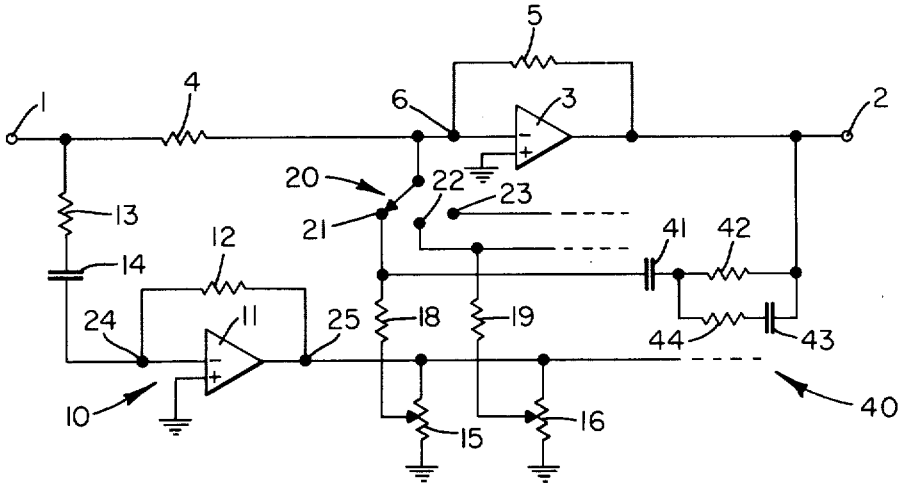
FIG. 3 is a schematic circuit diagram of an alternative embodiment of the equalization circuit of the present invention utilizing additional filter pre-emphasis circuits.

Additional compensating networks may be added for adjustable low frequency pre-emphasis or to provide other compensation. The additional networks are preferably switched using the same switch as utilized for high frequency pre-emphasis. As shown by way of example only in FIG. 3, additional networks 40, one or more for each operating speed, may be connected between the switch terminals 21, 22, 23 and the circuit output 2. The particular low frequency pre-emphasis circuit shown consists of a capacitor 41 in series with resistor 42. In parallel with resistor 42 is another series RC circuit comprising capacitor 43 and resistor 44. One similar circuit could be provided for each range of operation. The circuit, of course, need not take the form specifically described, but may be of any suitable configuration to provide the desired equalization.

The invention provides a high frequency equalization circuit in an audio pre-amplifier. The active filter circuit includes a series RC circuit connected to the input of [an] *a negative feedback* amplifier *forming an operational amplifier* for differentiating the input signal to the preamplifier. The output of the filter amplifier is connected to ground through a plurality of variable resistances connected in parallel. Each variable resistance provides a means to vary the amount of high frequency boost utilized at one of a plurality of tape speeds of an audio tape recorder. Accordingly, one [RC differentiator and amplifier are] *differentiating amplifier is* utilized at all operating speeds requiring a minimum of component change for different speeds. Due to the described circuit configuration, there is a very low noise contribution to the preamplifier from the active filter circuit except at close to maximum boost or pre-emphasis when the noise contribution is at high frequencies only. Since the variable resistances are grounded at one end, there is no noise contribution at zero boost when the taps on the resistances are set to ground. The input signal is passed both through the filter and through a resistor directly into the preamplifier where the sum of the two components is amplified. An alternative embodiment of the invention includes additional pre-emphasis circuits connected to be selectively switched with the adjustable resistances to provide low frequency or other desired special equalization.

Although the invention has been described herein with reference to two embodiments, it is to be understood that various modifications may be made thereto within the spirit and scope of the invention. Thus it is not intended to limit the invention except as defined in the following claims:

What is claimed is:

1. An equalization circuit comprising:

an input *terminal;* amplifying means *having an input* connected to said input *terminal;* filter circuit means having an output [connected] *for connection* to said input *of said amplifying means and* for providing a signal varying in amplitude with frequency at its output;

a plurality of adjustable resistances corresponding to a plurality of operating ranges connected to the output of said filter circuit means for adjusting the signal amplitude provided by the output; and switch means for selectively connecting one of said plurality of adjustable resistances to said *input of said* amplifying means according to one selected operating range.

2. The circuit of claim 1 wherein:

said filter circuit means provides a signal which rises with frequency.

3. The circuit of claim 1 wherein:

said filter circuit means comprises an RC series circuit [connect] *connected* to said input *terminal.*

4. The circuit of claim 1 wherein:

said filter circuit means comprises active filter means.

5. The circuit of claim 1 wherein:

said filter circuit means comprises differentiating means.

6. An equalization circuit comprising:

an input terminal;

a first amplifier having an input and an output;

an input resistance connected between said input terminal and the input of said first amplifier; and, a filter circuit connected in parallel with said input resistance including:

circuit means having an output to filter a signal received at said input terminal;

a plurality of adjustable resistances connected to the output of said filter circuit means, each of said resistances selected according to a different one of a plurality of operating ranges for adjusting the amplitude of the signal provided by said filter circuit means; and, switch means connected between said plurality of adjustable resistances and the input of said first amplifier for selectively connecting said adjustable resistances to said first amplifier.

7. A circuit of claim 6 wherein:

said filter circuit means provides a signal varying with frequency.

8. The circuit of claim 6 wherein:

said filter circuit means provides a signal rising with frequency.

9. The circuit of claim 8 wherein:

said filter circuit means includes an RC circuit connected to said input terminal and a second amplifier connected to said RC circuit, the output of said second amplifier being connected to said plurality of adjustable resistances.

10. The circuit of claim 9 wherein:

said switch means comprises a plurality of contacts connected respectively to said plurality of variable resistances; and further including:

a plurality of frequency pre-emphasis means connected respectively between said plurality of contacts and the output of said first amplifier.

11. The circuit of claim 6 wherein:

said filter circuit means comprises an RC series circuit connected to said input terminal.

12. The circuit of claim 6 wherein:

said filter circuit means comprises active filter means.

13. The circuit of claim 6 wherein:

said filter circuit means comprises differentiating means.

*14. An equalization circuit, comprising:*

*a. an input terminal for receiving an input signal to be equalized;*

*b. a first amplifying means having an input and an output;*

*c. a first means for connecting said first amplifying means to said input terminal and providing an output signal which is substantially in phase with said input signal;*

*d. a phase shift circuit means coupled to said input terminal and providing an output signal having an increasing amplitude and constant phase lag with frequency relative to said input signal, within a predetermined frequency range of said input signal;*

*e. a second means for connecting the output of said phase shift circuit means to said input of said first amplifying means; and*

*f. said first amplifying means providing an output signal representative of the sum of said respective output signals provided by said first connecting means and said phase shift means.*

*15. The circuit of claim 14 wherein:*

*said phase shift circuit means provides an output signal increasing in amplitude and lagging in phase by 90°.*

*16. The circuit of claim 15 wherein:*

*said phase shift circuit means comprises an inverting differentiating operational amplifier means.*

*17. The circuit of claim 14 wherein said second connecting means comprises a plurality of variable resistances and switch means for selectively connecting one of said plurality of variable resistances to the input of said first amplifying means.*

*18. The circuit of claim 14 wherein said second connecting means comprises a resistive means.*

*19. An equalization circuit comprising:*

*a. an input terminal for receiving an input signal to be equalized;*

*b. a first amplifying means having an input and an output, said input of the first amplifying means coupled to said input terminal to receive a signal which is substantially in phase with said input signal;*

*c. a second amplifying means having an input, an output, a feedback resistor connected between said output and input to provide negative feedback, and a capacitive reactive impedance means coupled between said input terminal and the input of said second amplifying means, said second amplifying means providing an output signal increasing in amplitude and having a constant phase lag with frequency relative to input signal within a predetermined frequency range of said input signal; and*

*d. means for connecting the output of said second amplifying means to said input of said first amplifying means.*

*20. The circuit of claim 19 wherein:*

*said connecting means comprises a plurality of variable resistances; and*

*switch means for selectively connecting one of said plurality of variable resistances to the input of said first amplifying means.*

*21. The circuit of claim 20 wherein:*

*said switch means further comprises a plurality of contacts connected respectively to said plurality of variable resistances; and further including*

*a plurality of frequency pre-emphasis means connected respectively between said plurality of contacts and the output of said first amplifying means.*

* * * * *